US007113603B1

(12) United States Patent
Cahill

(10) Patent No.: US 7,113,603 B1
(45) Date of Patent: Sep. 26, 2006

(54) THERMAL OVERLOAD AND RESONANT MOTION CONTROL FOR AN AUDIO SPEAKER

(75) Inventor: David Cahill, Merrimac, MA (US)

(73) Assignee: Boston Acoustics, Inc., Peabody, MA (US)

( * ) Notice: Subject to any disclaimer, the term of this patent is extended or adjusted under 35 U.S.C. 154(b) by 0 days.

(21) Appl. No.: 09/392,019

(22) Filed: Sep. 8, 1999

(51) Int. Cl.
*H03G 11/00* (2006.01)

(52) U.S. Cl. .......................................... 381/55; 381/96

(58) Field of Classification Search .................. 381/61, 381/121, 55, 59, 63, 96
See application file for complete search history.

(56) References Cited

U.S. PATENT DOCUMENTS 4,969,195 A * 11/1990 Noro ........................... 381/96
5,206,912 A * 4/1993 Noro ........................... 381/96
5,761,316 A * 6/1998 Pritchard ..................... 381/61

* cited by examiner

*Primary Examiner*—Ping Lee
(74) *Attorney, Agent, or Firm*—Peter A. Nieves, Esq.; Sheehan, Phinney, Bass & Green, P.A.

(57) ABSTRACT

A thermal overload and resonant motion control circuit is provided for an audio speaker, the circuit generating a feedback signal to control the input applied to the speaker, which feedback signal is dependent on both the drive current to the speaker and the speaker impedance. More specifically, the feedback signal has a voltage which is substantially equally to the absolute value of K(bv−ai)H(s); where,
K=a gain for the circuit,
i=current of drive signal applied to the speaker,
v=voltages of drive signal,
a=percentage of drive current (i) sensed by the control circuit;
b=percentage of drive voltage (v) sensed by the control circuit,
H(s)=a lowpass filter transfer function for a lowpass filter of the control circuit, and
s=a complex frequency variable.

1 Claim, 2 Drawing Sheets

Control voltage vs voice coil impedance and current for 12.52 in ft^3 box

THERMAL OVERLOAD AND RESONANT MOTION CONTROL FOR AN AUDIO SPEAKER

FIELD OF THE INVENTION

This invention relates to audio speakers and, more particularly, to a single, relatively simple and inexpensive control circuit for such speakers, which circuit responds to both drive current and resonance-induced speaker movement.

BACKGROUND OF THE INVENTION

Audio speakers, particularly when being driven at the upper end of their operating range, are subject to failure in at least two ways. First, an excessive drive current applied to the voice coil of the speaker or a high current applied for an excessive time can overheat and burn out the voice coil and/or cause other damage in the speaker. Heating of the voice coil is also a function of the exclosure used for the speaker, ambient temperature, and other factors. Second, speaker cones have a resonant frequency and, for a given drive signal, cone movement will be significantly greater at or near the cone's resonant frequency than for drive signals at other frequencies. Particularly when a speaker is being driven in its upper operating ranges, additional cone movement caused by resonance can overdrive the cone, causing tearing or other damage thereto and/or to components of the speaker attached to or otherwise moving with the cone.

Heretofore, the problem of protecting a woofer or other speaker from overload damage has been dealt with by providing an electrical circuit to monitor current drive to the speaker and generate a feedback control in response thereto and a separate device, generally a low impedance mechanical device such as an accelerometer or secondary sensing coil, to detect cone movement, including movement as a result of resonance, and to generate a separate feedback signal in response to such movement. No mechanism has been provided for directly (or indirectly) measuring/detecting coil temperature and compensating for increases in such temperature. While such overload control/protection circuits for speakers utilizing two separate detection schemes, including the mechanical detection scheme for cone movement, are generally effective for protecting the speakers, this arrangement is relatively complicated and expensive, particularly the mechanical detectors for cone movement, and it would be preferable if a single, all electronic circuit could be provided to detect and provide control/protection for both drive-current-induced thermal overload and excessive cone movement resulting from resonance or other causes. It would also be desirable if such circuit could detect heating of the voice coil and compensate for such heating, regardless of cause.

SUMMARY OF THE INVENTION

In accordance with the above, this invention provides a thermal overload and resonant motion control circuit for an audio speaker driven by a drive signal from an amplifier, which circuit includes a feedback signal generating (fsg) circuit, the feedback signal being dependent on both drive current to the speaker and speaker impedance, and more specifically, the feedback voltage $V_{fb}$=f (ai, bv), where i and v are drive current and drive voltage respectively for the drive signal, and where a and b are percentages of i and v respectively utilized by the feedback signal generating circuit. An attenuator is also provided which is operable in response to the feedback signal for controlling the drive signal, and in particular, the amplitude thereof. The feedback signal generating circuit is preferably a control voltage amplifier having a gain K, the feedback signal outputted from this amplifier being proportional to the absolute value of K (bv−ai). For one embodiment a=b. For an illustrative embodiment (a) is approximately 0.15% to 0.5% and (b) is approximately 0.5%. For a preferred embodiment, the fsg circuit includes a lowpass filter having a transfer function H(s), the feedback signal for this embodiment being K(bv−ai)H(s).

A sense resistor is provided for preferred embodiments through which drive signal is applied to the speaker, the feedback signal generating circuit including a component for sensing the current across the sense resistor. For a preferred embodiment, the feedback signal generating circuit has a first differential amplifier which senses the current across the sense resistor and generates an output which is (ai), a second differential amplifier having the drive voltage applied thereto and generating an output which is (bv) and a third differential amplifier having the output from the first and second differential amplifiers as inputs, and having a gain K, the feedback signal being outputted from the third differential amplifier. For a preferred embodiment, the third differential amplifier has a lowpass filter in a feedback loop thereof.

The attenuator may include a converter which receives the feedback signal and generates a DC output which is a selected function of the received feedback signal, for example an average, peak and/or RMS value of the feedback signal, and a variable impedance component through which either the input or the output of the amplifier is applied, the DC output being applied to control the impedance of the variable impedance component. The variable impedance component may, for example, be a compressor and/or a limiter.

The foregoing and other objects, features and advantages of the invention will be apparent in the following more particular description of a preferred embodiment of the invention as illustrated in the accompanying drawings, the same reference numeral being used for like elements in all the figures.

IN THE DRAWINGS

DETAILED DESCRIPTION

Figure 1:
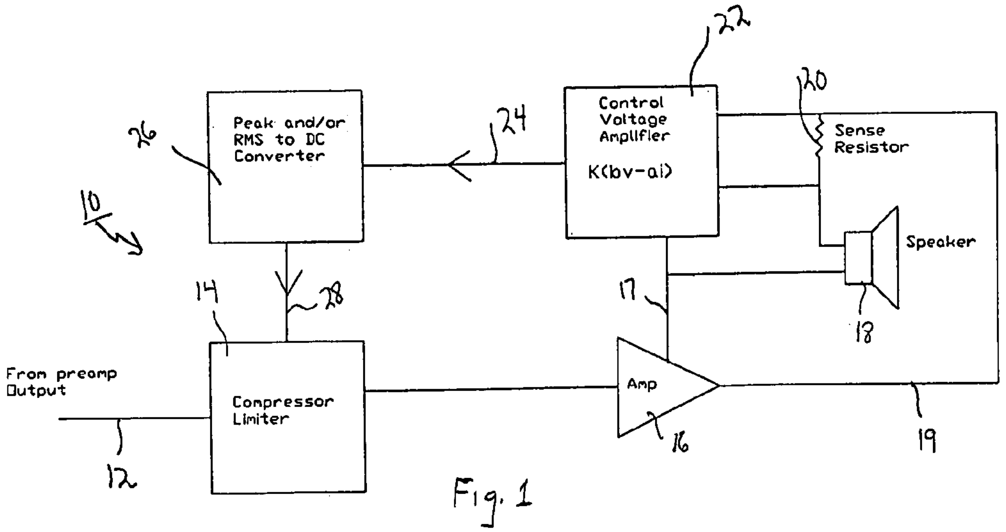
FIG. 1 is a schematic block diagram of a speaker incorporating the protection circuit of this invention.

Referring to FIG. 1, the circuit 10 has an input signal from a preamplifier or other suitable source applied through line 12 and a compressor/limiter circuit 14 to an amplifier 16. Amplifier 16 has an output line 17 applied directly to speaker 18 and a second output line 19 applied to the speaker through a sense resistor 20. The voltage across sense resistor 20 is applied to two inputs of a control voltage amplifier 22, a second input to amplifier 22 being the signal on line 17. Amplifier 22 generates a feedback signal output on line 24 which output is given by K (bv−ai)H(s) where:

K=gain of amplifier 22;

i=current of drive signal applied to speaker 18;

v=voltage of drive signal;

a=the percentage of the drive current (i) sensed by amplifier 22; and b=percentage of the drive voltage (v) sensed by amplifier 22.

H(s)=a low pass filter transfer function to be discussed later; and s=a complex frequency variable (jw).

The feedback signal on line 24 is applied to a converter 26 which converts a function of this feedback signal, which is the average, peak and/or RMS value of the feedback signal for the illustrative embodiment, to a DC voltage on line 28. This DC voltage is applied to control attenuation in compressor/limiter circuit 14. Circuit 14 may be any of a variety of circuits currently available which perform this function in prior art speaker overload control or protection circuits and converter 26 may also be a standard circuit appropriate for use with the circuit 14. Circuit 14 may for example be a voltage controlled variable resistor. Circuits 14 and 26 are frequently sold together as a package on the same chip or board. Circuit 14 is preferably on the input side of amplifier 16 as shown, but may also be on the output side of the amplifier.

Figure 2:
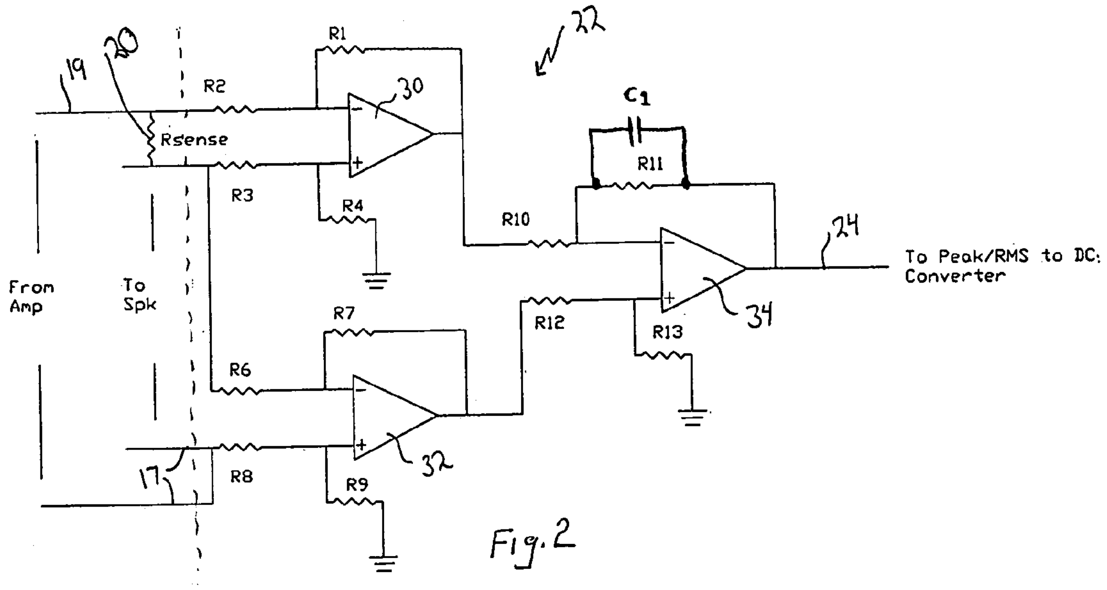
FIG. 2 is a schematic diagram of a control voltage amplifier suitable for use in the circuit of FIG. 1.

Referring now to FIG. 2, which is a schematic diagram of the sense resistor 20 and of control voltage amplifier 22, for a preferred embodiment it is seen that amplifier 22 is made up of three differential amplifiers 30, 32 and 34. The signal on line 19, which is passed through sense resistor 20 to speaker 18, is applied directly through resistor R2 to the minus input of amplifier 30 and through sense resistor 20 and resistor R3 to the positive input of this differential amplifier. The output from amplifier 30 is fed back through resistor R1 to the negative input of the amplifier and the positive input to amplifier 30 is connected to ground through resistor R4.

The two inputs to speaker 18 are connected through resistors R6 and R8 to the negative input and the positive input respectively of differential amplifier 32, this amplifier thus seeing the voltage across speaker 18. The output from amplifier 32 is connected to its negative input through resistor R7 and the positive input to this amplifier is connected to ground through resistor R9. The output from differential amplifier 30 is connected through resistor R10 to the negative input of differential amplifier 34 and the output from differential amplifier 32 is connected through resistor R12 to the positive input of amplifier 34. The output of amplifier 34 is output line 24 from amplifier 22, the output on this line also being fed back through a lowpass filter, formed by capacitor C1 and resistor R11 connected in parallel, to the negative input of differential amplifier 34. The positive input to this differential amplifier is connected to ground through resistor R13.

For an illustrative embodiment, the value of sense resistor 20 is approximately 0.05 ohms, resulting, in conjunction with the values of resistors R1–R4, in (a), the percentage of drive current constant, being relatively low, this constant typically being in the range of approximately 0.15% to 0.5% for illustrative embodiments. However, depending on the speaker, this value may be substantially larger, for example 5%. Similarly, the values of the various resistors R6–R9 and the parameters of differential amplifier 32 are such that (b), the percentage of drive voltage constant, is also relatively low, typically approximately 0.5% of the speaker drive voltage for illustrative embodiments. Again, depending on the speaker, this percentage may be substantially higher. One skilled in the art can select circuit parameters to achieve a desired negative feedback profile.

For the illustrative embodiment shown in FIG. 2, (a) is given by (R1/R2) Rsense, this relationship being true where R1=R4 and R2=R3. Similarly, (b) is R7/R6 where R7=R9 and R6=R8. K is given by R11/R10 for the circuit where R11=R13 and R10=R12. K for an illustrative embodiment might be approximately 10 to 20. Since it is important that amplifier 22 draw as little current from speaker 18 as possible, control voltage amplifier 22 should have a high input resistance, this being achieved by resistors R2, R3, R6 and R8 all having high resistance values which are typically at least 100 Kohms. Further, since differential amplifiers are being used, the tolerances of the various resistance should be held to 1% or better.

Figure 3:
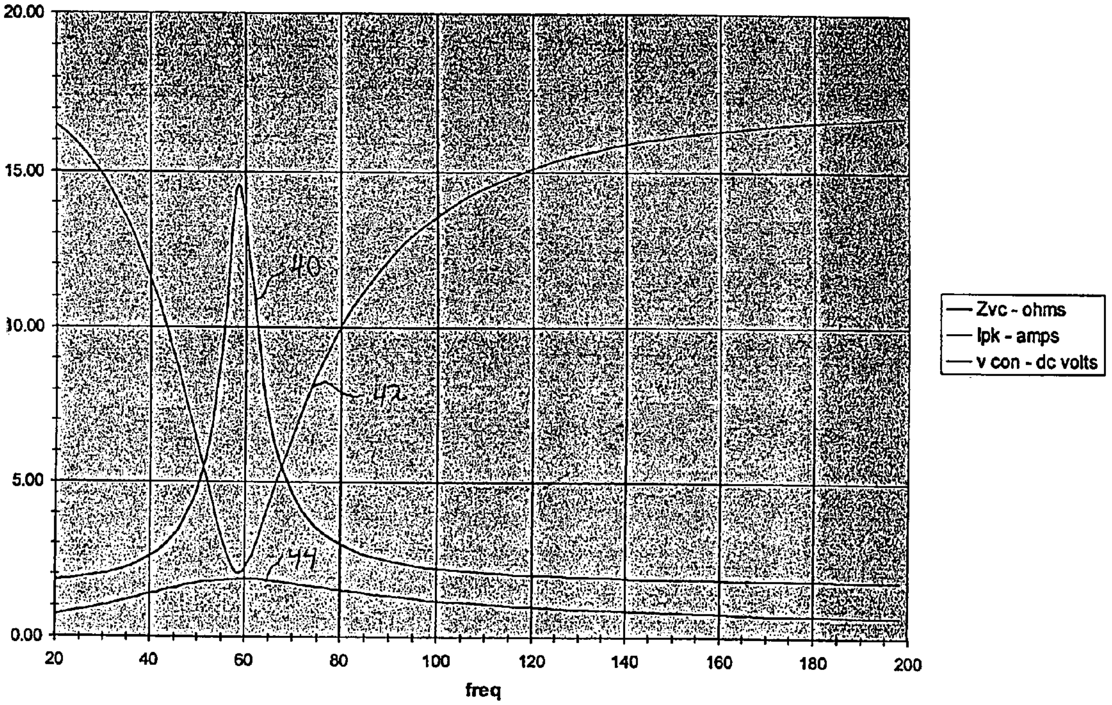
FIG. 3 is a chart illustrating speaker impedance and current as a function of frequency for an illustrative speaker, as well as a control voltage in accordance with the teachings of this invention for such a speaker.

A unique feature of this invention is the use of the absolute value of the difference term (bv−ai) (or ai−bv) in generating the feedback or control voltage, which makes this voltage proportional to both the speaker drive current and, since speaker impedance z=v/i, to speaker impedance. Thus, the value of the feedback or control voltage out of circuit 22 on line 24 may be rewritten to be K(bzi−ai)H(s), where z is the speaker impedance. Because the impedance of the speaker is related to its motion, the control voltage being a function of both drive current and speaker impedance is, therefore, related to both driver motion and drive current. The speaker impedance in a sealed box reaches its maximum value at resonance, the drive current being a minimum at this frequency. If a=b, then the control voltage will also reach its maximum at resonance. This increase in control voltage at resonance can be used to make the compressor/limiter 14 apply greater attenuation at resonance. This is illustrated in FIG. 3 for an illustrative speaker having a resonance at approximately 58 Hz, the speaker being a woofer in a sealed box with a peak drive voltage of 30 volts across the speaker. In this graph, line 40 charts speaker impedance as a function of frequency, impedance peaking at resonance, line 42 shows drive current as a function of frequency, drive current being a minimum at resonance, and line 44 shows the control voltage on line 28 generated by the circuits of FIGS. 1 and 2 for the illustrative speaker as a function of frequency, it being seen that the control voltage also peaks to maximize attenuation at resonance. It can be shown, with more rigorous mathematical analysis, that typically a driver's motion is large at resonance, particularly for high drive voltage levels, and becomes more under-damped as the voice coil temperature rises due to high current drive levels at other frequencies where the impedance is much lower. The values of a and b can be utilized to adjust the amount of compression/attenuation applied at a high impedance/high speaker motion, as opposed to how much is applied at frequencies above and below resonance. The values of (a) and (b) are selected based on the desired change in Q of the speaker at high voice coil temperatures, on drive motion above and below the tuning frequency of the audio system in which speaker 18 is employed, and on other factors. The frequency of the lowpass filter formed by C1 and R11 is also determined by driver motion above and below system tuning frequency. This filter acts as a first order lowpass filter to facilitate control of the limit/compression threshold at frequencies above the system tuning frequency (i.e., the compression threshold is higher at second impedance peaks where driver excursions may not need to be restricted as much as for first impedance peaks.)

The circuit of this invention also provides some thermal tracking because the control voltage will increase for a given input or drive voltage due to increased voice coil resistance resulting from coil heating caused by high currents. Thus, drive may be reduced in response to detected coil heating because of the dependence of the control voltage on speaker impedance, independent of the applied current. Therefore, whereas the prior art protection circuits might not increase control voltage in response to a below-threshold current applied for an extended time, the circuit of this invention will pick up impedance changes resulting from such extended high current levels and generate appropriate increased control voltage to protect the voice coil. Since the speaker impedance shape is also determined by the box size, the circuit of this invention is also self-adjusting for different enclosure sizes. Finally, the differential input sensing scheme of this invention allows the protection circuit to be used with bridged amplifiers.

While for the preferred embodiment discussed above, the K(bv−ai)H(s) control signal on line 24 is generated by use of an amplifier 22 formed of the three differential amplifiers 30, 32, 34, the generation of the control signal on line 24 in this way is not a limitation on the invention, and it is possible that this control signal might be generated in other ways. For example, op amps 30 and 32 could be replaced with simpler non-differential amplifiers when the circuit is used with non-bridged power amplifiers. Differential amplifier 34 would still be used in such a circuit. Another option would be to replace special purpose circuit 22 with a suitably programmed digital signal processor or other suitable processor for generating the desired feedback signal. In this case, an analog-to-digital converter would be utilized at the input to the processor to convert the current sense and voltage sense signals and a digital-to-analog converter would be provided for the feedback signal at the output from the processor. While performing the feedback signal generation digitally might be more complicated and expensive for performing this single function, if there is already a DSP chip in the system being utilized to perform other functions, utilizing the DSP or other processor to generate the control feedback signal on line 24, and to perhaps perform other functions such as the RMS to DC or peak to DC conversion functions, and possibly even the limiter/compressor function, may prove to be cost effective since all signal modifications could be done in the software of the processor.

While the invention has been shown and described above with reference to a preferred embodiment, it will be apparent that the foregoing and other changes in form and detail may be made therein by one skilled in the art without departing from the spirit and scope of the invention which is to be defined only by the appended claims.

What is claimed is:

1. A thermal overload and resonant motion control circuit for an audio speaker having a driver, where the audio speaker is driven by a drive signal from an amplifier, the circuit including:

a feedback signal generating (fsg) circuit for generating a feedback signal, said feedback signal being an absolute difference between a proportion of a drive voltage and a proportion of a drive current; and an attenuator operable in response to said feedback signal for controlling said drive signal, wherein said feedback signal is given by f(ai, bv), where i and v are drive current and drive voltage respectively for said drive signal, and where a and b are percentages of i and v respectively utilized by said fsg circuit and wherein said attenuator includes a converter which receives said feedback signal and generates a DC output which is a selected function of the received feedback signal, and a variable attenuator component through which one of the input and output of said amplifier is applied, said DC output being applied to control the level of said variable attenuator component, wherein said drive signal is related to motion of said driver and said drive current, wherein said feedback signal is proportional to the absolute value of K (bv−ai) where K is a gain in said fsg circuit, and wherein a is approximately 0.15% to 0.5% and b is approximately 0.5%.

* * * * *